(12) United States Patent
Daigo (10) Patent No.: US 12,280,425 B2
(45) Date of Patent: Apr. 22, 2025

(54) ADDITIVE MANUFACTURING ARTICLE AND METHOD FOR PRODUCING ADDITIVE MANUFACTURING ARTICLE

(71) Applicant: Proterial, Ltd., Tokyo (JP)

(72) Inventor: Yuzo Daigo, Tokyo (JP)

(73) Assignee: Proterial, Ltd., Tokyo (JP)

( * ) Notice: Subject to any disclaimer, the term of this patent is extended or adjusted under 35 U.S.C. 154(b) by 733 days.

(21) Appl. No.: 17/434,421

(22) PCT Filed: Mar. 2, 2020

(86) PCT No.: PCT/JP2020/008599
§ 371 (c)(1),
(2) Date: Aug. 27, 2021

(87) PCT Pub. No.: WO2020/179724
PCT Pub. Date: Sep. 10, 2020

(65) Prior Publication Data
US 2022/0143701 A1    May 12, 2022

(30) Foreign Application Priority Data
Mar. 4, 2019    (JP) .................................. 2019-038723

(51) Int. Cl.
*B22F 10/28*    (2021.01)
*B22F 10/60*    (2021.01)
(Continued)

(52) U.S. Cl.
CPC .............. *B22F 10/28* (2021.01); *B22F 10/60* (2021.01); *B33Y 10/00* (2014.12); *B33Y 40/20* (2020.01);
(Continued)

(58) Field of Classification Search
None
See application file for complete search history.

(56) References Cited

U.S. PATENT DOCUMENTS 4,022,947 A * 5/1977 Grubb ..................... C23C 14/08
359/359
5,656,099 A * 8/1997 Ohmi ........................ C23C 8/18
148/283
(Continued)

FOREIGN PATENT DOCUMENTS

CN    107127343 A  *  9/2017
CN    108889949       11/2018
(Continued)

OTHER PUBLICATIONS

Zhang, Y.N., et al. "Oxide films in laser additive manufactured Inconel 718." Acta Materialia, vol. 61, No. 17, Oct. 2013, pp. 6562-6576 (Year: 2013).*
(Continued)

*Primary Examiner* — Sally A Merkling
*Assistant Examiner* — Ricardo D Morales
(74) *Attorney, Agent, or Firm* — JCIPRNET (57) ABSTRACT

An additive manufacturing article according to the present invention is composed of an Ni-based alloy that contains Cr and Mo, while containing Ni in the largest amount in terms of the mass ratio; and an oxide film that is mainly composed of Cr is formed in a part or the entirety of the surface. This oxide film that is mainly composed of Cr has a region wherein the O content is higher in comparison to that in the inner part, and the Cr content is higher than the Ni content. It is preferable that this oxide film has a thickness of 1-20 nm from the surface; and it is also preferable that this oxide film is formed so as to be suited to a corrosive environment contact surface. In addition, this oxide film is able to be formed during additive manufacturing of the additive manufacturing article.

7 Claims, 6 Drawing Sheets

(51) Int. Cl.
   *B33Y 10/00*  (2015.01)
   *B33Y 40/20*  (2020.01)
   *B33Y 80/00*  (2015.01)
   *C22C 19/05*  (2006.01)
   *H01L 21/02*  (2006.01)

(52) U.S. Cl.
   CPC .............. *B33Y 80/00* (2014.12); *C22C 19/05* (2013.01); *B22F 2301/15* (2013.01); *B22F 2302/25* (2013.01); *H01L 21/02* (2013.01)

(56) References Cited

U.S. PATENT DOCUMENTS

| | | | |
|---|---|---|---|
| 9,579,722 B1* | 2/2017 | Alvin | B22F 7/004 |
| 2009/0123775 A1* | 5/2009 | Kanzaki | C22C 19/05 |
| | | | 427/237 |
| 2015/0322560 A1* | 11/2015 | Masaki | C22F 1/00 |
| | | | 428/332 |
| 2017/0189995 A1* | 7/2017 | Zenou | B33Y 10/00 |
| 2017/0297098 A1* | 10/2017 | Myerberg | B28B 1/001 |
| 2017/0298478 A1* | 10/2017 | Masaki | F16L 9/02 |
| 2018/0327913 A1* | 11/2018 | Lansalot-Matras | C23F 1/12 |
| 2019/0299528 A1* | 10/2019 | Clark | B33Y 30/00 |

FOREIGN PATENT DOCUMENTS

| | | |
|---|---|---|
| JP | S62137172 | 6/1987 |
| JP | 2004342845 | 12/2004 |
| JP | 2006265580 | 10/2006 |
| JP | 2006274386 | 10/2006 |
| JP | 5725630 | 5/2015 |
| JP | 2016502596 | 1/2016 |
| JP | 2017043838 | 3/2017 |
| JP | 2017508877 | 3/2017 |
| JP | 2017533996 | 11/2017 |
| JP | 2018103463 | 7/2018 |
| JP | 2018168400 | 11/2018 |

OTHER PUBLICATIONS

Babu, S. S., et al. "Additive manufacturing of nickel superalloys: Opportunities for innovation and challenges related to qualification." Metallurgical and Materials Transactions A, vol. 49, No. 9, Jun. 1, 2018, pp. 3764-3780 (Year: 2018).*
Machine Translation of CN-107127343-A (Year: 2017).*
"International Search Report (Form PCT/ISA/210) of PCT/JP2020/008599," mailed on Apr. 28, 2020, with English translation thereof, pp. 1-6.

* cited by examiner

ADDITIVE MANUFACTURING ARTICLE AND METHOD FOR PRODUCING ADDITIVE MANUFACTURING ARTICLE

CROSS-REFERENCE TO RELATED APPLICATION

This application is a 371 application of an international PCT application serial no. PCT/JP2020/008599, filed on Mar. 2, 2020, which claims the priority benefit of Japan application JP2019-038723, filed on Mar. 4, 2019. The entirety of each of the above-mentioned patent applications is hereby incorporated by reference herein and made a part of this specification.

TECHNICAL FIELD

The present invention relates to an additive manufacturing article composed of an Ni-based alloy and a method for producing an additive manufacturing article.

BACKGROUND ART

In additive manufacturing, for example, as disclosed in Patent Literature 1, a heat source is supplied to a raw material powder and the raw material powder is repeatedly melted and solidified, thereby obtaining an additively manufactured article having a three-dimensional shape. According to additive manufacturing, a product having a three-dimensional shape can be obtained in a net shape or a near net shape. As disclosed in Patent Literature 1, the term "additive manufacturing" is considered as an industrial standard term as regulated by the American Society for Testing and Materials (ASTM) F2792.

CITATION LIST

Patent Literature

[Patent Literature 1]
Published Japanese Translation No. 2016-502596

SUMMARY OF INVENTION

Technical Problem

Additive manufacturing (AM) has a significant advantage in its capability of obtaining a product having a three-dimensional shape in a net shape or a near net shape. In additive manufacturing, an additive manufacturing article is produced through processes that are different from conventional processes, such as fusion, casting, forging and rolling or sintering of a metal powder, in the metallic material field.

Therefore, an objective of the present invention is not only to obtain a product having a three-dimensional shape in a net shape or a near net shape using additive manufacturing (hereinafter, referred to as additive manufacturing) but also to provide an additive manufacturing article composed of an Ni-based alloy having excellent corrosion resistance and a method for producing an additive manufacturing article.

Solution to Problem

An additive manufacturing article of the present invention is composed of an Ni-based alloy that contains Cr and Mo, while containing Ni in a largest amount in terms of a mass ratio, and an oxide film that is mainly composed of Cr is formed in a part or an entirety of a surface.

In the additive manufacturing article of the present invention, the oxide film that is mainly composed of Cr preferably has a region where an O content is higher in comparison to that in an inner part and a Cr content is higher than a Ni content.

The oxide film in the present invention preferably has a thickness of 1 to 20 nm from the surface of the additive manufacturing article.

In addition, the oxide film in the present invention is preferably formed so as to be suited to a corrosive environment contact surface.

The additive manufacturing article of the present invention is preferably used as a component for semiconductor manufacturing device.

The present invention also provides a method for producing an additive manufacturing article. This production method has a step of producing, by additive manufacturing, an additive manufacturing article composed of an Ni-based alloy that contains Co and Mo, while containing Ni in a largest amount in terms of a mass ratio, and, at the time of the additive manufacturing, an oxide film that is mainly composed of Cr is formed in a part or an entirety of a surface of the additive manufacturing article.

In the method for producing an additive manufacturing article of the present invention, it is preferable that the additive manufacturing of the additive manufacturing article be performed by powder bed fusion in which a laser beam or an electron beam is used, and that this additive manufacturing be performed in an atmosphere having an oxygen concentration of 10 to 2000 ppm.

In addition, in the method for producing an additive manufacturing article of the present invention, the additive manufacturing is performed by powder bed fusion in which a laser beam or an electron beam is used, and it is preferable that the surface of the additive manufacturing article on which the oxide film is to be formed be irradiated with a laser beam or an electron beam repeatedly twice or more.

Advantageous Effects of Invention

According to the present invention, since the oxide film that is mainly composed of Cr is formed in a part or the entirety of the surface of the additive manufacturing article composed of the Ni-base alloy that contains Cr and Mo, while containing Ni in the largest amount in terms of the mass ratio, it is possible to improve corrosion resistance.

BRIEF DESCRIPTION OF DRAWINGS (a) to (b-4) of FIG. 1 are views showing scanning forms of a laser beam or the like in additive manufacturing.

(a) and (b) of FIG. 2 are graphs showing the results of corrosion tests in an example of the present invention.

(a) and (b) of FIG. 3 show observation results of the behaviors of elements in surface layer portions in the example, wherein (a) of FIG. 3 is the observation results of an additive manufacturing article that is not polished, and (b) of FIG. 3 is the observation results of an additive manufacturing article that has been polished.

(a) to (d) of FIG. 4 show photographs of the microstructures of the etched additive manufacturing article in the present example, wherein (a) of FIG. 4 is the structure of an XY surface observed with an optical microscope, (b) of FIG. 4 is the structure of a Z surface observed with the optical microscope, (c) of FIG. 4 is the structure of the Z surface observed with a SEM, and (d) of FIG. 4 is a pattern diagram drawn with reference to (c) of FIG. 4.

(a) of FIG. 5 shows a reflected electron image of a forged article (unetched) captured with a SEM, (b) of FIG. 5 shows a reflected electron image of an additive manufacturing article 1 (unetched) captured with the SEM, (c) of FIG. 5 shows the composition maps of Mo in the additive manufacturing article 1 observed by EDX with the SEM, and (d) of FIG. 5 shows a reflected electron image of the additive manufacturing article 1 (etched) after a solution treatment captured with the SEM.

(a) and (b) of FIG. 6 show ternary calculation phase diagrams of Ni, Cr and Mo, wherein (a) of FIG. 6 is the phase diagram at 600° C., and (b) of FIG. 6 is the phase diagram at 1250° C.

DESCRIPTION OF EMBODIMENTS

Hereinafter, an additive manufacturing article according to an embodiment of the present invention will be described with reference to the accompanying drawings. The additive manufacturing article according to the present embodiment is composed of an Ni-based alloy that contains Cr and Mo and is capable of improving corrosion resistance due to the formation of an oxide film that is mainly composed of Cr on the surface layer. In addition, the additive manufacturing article according to the present embodiment is composed of an Ni-based alloy that contains Cr and Mo and is capable of obtaining a high strength in comparison to Ni-based alloys that have the same composition and have been forged and rolled. In the present specification, numerical ranges expressed using "to" include numerical values before and after "to" as the lower limit value and the upper limit value.

[Additive Manufacturing]

Additive manufacturing intended for metallic materials can be classified into powder bed fusion (PBF) and directed energy deposition (DED), and the additive manufacturing article of the present embodiment can be molded by any method.

The powder bed fusion is called a powder bed method and is a method in which a metal powder is spread and a portion to be molded is melted with a laser beam or an electron beam, which serves as a heat source, and solidified (hereinafter, referred to as melting and solidification). A solidified layer is formed by spreading a metal powder and melting and solidifying the metal powder, and this operation is repeatedly performed to laminate solidified layers, thereby molding a member having a predetermined shape. As the powder bed method, there are a laser beam heat source method and an electron beam heat source method which will be described below.

The laser beam heat source method is a method in which additive manufacturing is performed by irradiating a metal powder material that has been spread with a laser beam to melt and solidify or melt and sinter the metal powder material, and selective laser melting (SLM) and selective laser sintering (SLS) are known. In the laser beam heat source method, the metal powder material is melted and solidified or melted and sintered in an inert atmosphere of nitrogen or the like.

In the electron beam heat source method, an electron beam is radiated and made to collide with a metal powder that has been spread in a high vacuum, thereby converting the kinetic energy into heat and melting the powder. In the electron beam method, a metal powder is melted and solidified in a vacuum.

The electron beam heat source method is called selective electron beam melting (SEBM) or simply EBM.

The directed energy deposition is called laser metal deposition (LMD), in which a metal powder is continuously sprayed at a forward position in a direction in which a laser beam or an electron beam is moved, and the supplied metal powder is irradiated with the laser beam or the electron beam to be melted and solidified, thereby molding the metal powder.

The powder bed method has an advantage of a high accuracy of the shape of an additive manufacturing article, whereas the laser metal deposition method has an advantage of a capability of high-speed molding. As the powder bed method, the SLM is a method in which a powder bed having a lamination thickness of several tens of micrometers is selectively melted and solidified using a fine laser beam and solidified layers are laminated to mold an article and has a characteristic of enabling the molding of precision components in comparison to other additive manufacturing methods. Therefore, in the present embodiment, in the case of molding a precision component, the SLM is preferably employed.

The scanning path of the laser beam or the electron beam in the powder bed method and the laser metal deposition method is arbitrary. For example, in an additive manufacturing article 1 shown in (a) of FIG. 1, the laser beam or the electron beam can be reciprocally scanned in a predetermined axial direction, for example, in parallel with the X-axis direction as shown in (b-1) of FIG. 1 or can be reciprocally scanned, for example, in parallel with the Y-axis direction as shown in (b-2) of FIG. 1. The former can be called an X scanning method, and the latter can be called a Y scanning method. Here, examples where the axial direction is in parallel to the X axis or the Y axis have been described; however, a predetermined axial direction may be in parallel to a direction that intersects the X axis and the Y axis as shown in (b-3) of FIG. 1. These cases can be called a uniaxial scanning method.

Figure 1:
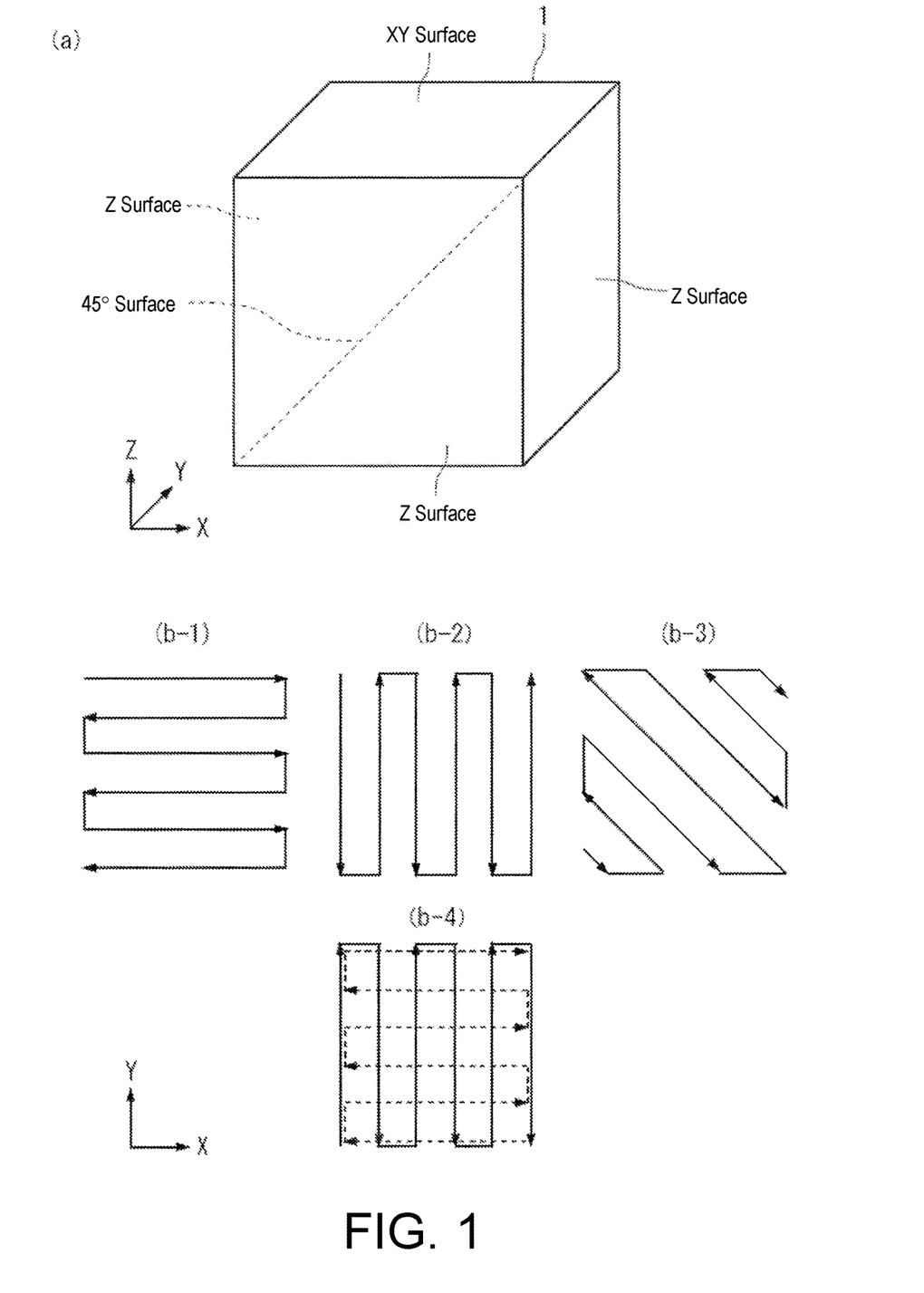

In addition, it is possible to employ a scanning path called an XY scanning method in which a preceding layer is molded by the X scanning method and then a subsequent layer is molded by the Y scanning method as shown in (b-4) of FIG. 1. In the case of molding an article by the uniaxial scanning method in directions that intersect each other, the method can be called an intersection scanning method, and the XY scanning method can be said to be one form of the intersection scanning method.

Furthermore, while not shown in the drawings, in the present embodiment, it is possible to employ a spiral scanning path.

Moreover, in the present embodiment, it is also possible to combine these scanning methods. That is, the additive manufacturing article 1 shown in (a) of FIG. 1 has a simple square structure; however, in the case of molding a member having a three-dimensional shape in a net shape or a near net shape, it is crucial to employ a scanning method suitable for the structure of the member. That is, the additive manufacturing article in the present invention is supposed to be interpreted in the broadest sense, and the shape, dimensions and applications, such as specific components and articles, of the additive manufacturing article are not limited.

As shown in (a) of FIG. 1, the additive manufacturing article 1 is laminated in the Z-axis direction, ordinarily, the vertical direction, the upper surface is called an XY surface, and each side surface is called a Z surface. Furthermore, in a case where the additive manufacturing article 1 is a cube as shown in (a) of FIG. 1, a surface that splits the additive manufacturing article 1 into halves along a diagonal line is called a 45° surface.

In addition, in the additive manufacturing article 1 shown in (a) of FIG. 1, on the XY surface, which is the upper surface, and the Z surfaces, which are the side surfaces, the heat source such as a laser beam is preferably scanned twice or more, for example, twice, since the dimensional accuracy or the surface accuracy improves. In the second and later scanning, the metal powder is not supplied, and only a laser beam or the like is scanned. The XY surface and the Z surfaces configure the outer surfaces of the additive manufacturing article 1. The plurality of times of scanning of a laser beam or the like contributes to improvement in the corrosion resistance of the additive manufacturing article 1, which will be described below.

[Corrosion Resistance]

The additive manufacturing article according to the present embodiment includes a film composed of an oxide that contains Cr as a configuration element ($Cr_2O_3$) in the surface layer and is thereby capable of improving corrosion resistance. This oxide film is formed within a range of 1 nm to 20 nm from the surface of the additive manufacturing article and preferably has a thickness of 1 nm to 10 nm. The thickness of the oxide film is formed to be a thickness of more preferably 2 to 8 nm and still more preferably 3 to 5 nm.

The oxide film according to the present embodiment is preferably formed by an oxidation treatment in a high-temperature environment and in a low-oxygen atmosphere. This oxidation treatment can be performed at the time of additive manufacturing. Since the oxide film is formed on the outer surface of the additive manufacturing article, the oxidation treatment that is performed at the time of additive manufacturing is performed at the time of molding the outer surface.

In the powder bed method in which a laser beam is used as a heat source, additive manufacturing is performed in an inert atmosphere of nitrogen, argon, or the like as described above, and, when a small amount of oxygen is contained in this inert gas, the oxidation treatment can be performed in a process of an additive manufacturing method in which a raw material alloy powder is melted and solidified.

The oxygen concentration in the oxidation treatment in the present embodiment is preferably set within a range of 100 ppm to 210%, more preferably set within a range of 100 ppm to 1%, and still more preferably within a range of 100 to 2000 ppm. The oxygen concentration is determined based on the volume.

In addition, the temperature in the oxidation treatment in the present embodiment is preferably set within a range of 300° C. to 1000° C., more preferably set within a range of 400° C. to 800° C., and still more preferably set within a range of 500° C. to 600° C.

The oxidation treatment is preferably performed at a low oxygen concentration within the above-described oxygen concentration range from the viewpoint of obtaining a dense oxide film; however, for example, even when the oxygen concentration is 210%, if a low temperature near 300° C. is selected, a dense oxide film can be generated.

[Mechanical Properties]

As described in an example described below, the additive manufacturing article according to the present embodiment improves in proof stress, tensile strength and hardness in comparison to a forged article that is an Ni-based alloy having the same chemical composition and is a material that has been forged and rolled. The additive manufacturing article in which these mechanical properties have improved has a region where Mo is segregated in the structure, that is, the Mo concentration is high in comparison to that in the surroundings. This segregated Mo is understood to function as a transition pinning effect and thereby improve the mechanical properties. The formation of the segregated Mo generates a Mo-deficient region where the Mo concentration is low in the surroundings.

When the amounts of Cr and Ni, which are other main configuration elements, are taken into account, the segregated Mo in the present embodiment is understood to be a μ phase, which is an intermetallic compound containing Mo, Cr and Ni as the configuration elements. The μ phase is a topologically close-packed (TCP) phase, the precipitation of the μ phase has thus far been recognized as a harmful phase for the mechanical properties, and, in forged materials, there has been a problem of cracking or the like caused by the degradation of, particularly, ductility. In addition, in forged materials, there has been another problem of the degradation of corrosion resistance caused by the generation of the Mo-deficient region attributed to the occurrence of the segregation. However, in additive manufacturing, originally, a product is finished to a near net shape, and thus the degradation of plastic workability does not become a problem. Furthermore, the degree of the segregation is an extremely fine and small amount, and thus the degradation of the corrosion resistance also does not become a problem. The segregated Mo that is formed in the additive manufacturing article does not function as a harmful phase and is capable of contributing to improvement in the mechanical properties.

The segregated Mo is formed inside crystal grains. The segregated Mo is formed in all of the crystal grains or formed in some of the crystal grains. The segregated Mo is preferably formed in 70% or more of the total number of the crystal grains, more preferably formed in 80% or more of the total number of the crystal grains, and still more preferably formed in 90% or more of the total number of the crystal grains.

Crystal grains in which the segregated Mo is formed have a columnar shape, and the structure of the additive manufacturing article has a cell structure in which cells in which these columnar crystal grains gather together are continuously disposed. Between a columnar crystal grain and another columnar crystal grain, that is, in a grain boundary, the Mo-deficient region is formed in the cell structure.

When a thermal treatment, specifically, a solution treatment, is performed on the additive manufacturing article, the mechanical properties can be adjusted as will be described in the example described below. This thermal treatment is performed in the atmosphere at 1100° C. to 1300° C. and more preferably 1150° C. to 1250° C. The thermal treatment may be performed by retaining the additive manufacturing article within the above-described temperature range for 0.5 hours or longer depending on the sizes of the additive manufacturing article.

In addition, when an ageing treatment, in which the additive manufacturing article is retained within a temperature range of 600° C. to 700° C. for approximately 24 hours, is performed in place of or in addition to the solution treatment, the strength, particularly, hardness of the additive manufacturing article can be further improved.

[Alloy Composition]

The additive manufacturing article 1 is composed of an Ni-based alloy that contains Cr and Mo, while containing Ni in the largest amount in terms of the mass ratio. This Ni-based alloy contains Cr and Mo in the second largest amount following Ni, and, in the Ni-based alloy in the present embodiment, Cr, Mo and Ni are said to be the main configuration elements. Among the main configuration elements, Cr and Mo are preferably contained in ranges of Cr: 14.5% to 24.5% and Mo: 12.0% to 23.0% in terms of mass %. The Ni content is specified as a balance with respect to not only Cr and Mo but also other elements. In addition, "%" that indicates the amount of a metal element means "mass %." In addition, the upper limit value and the lower limit value can be arbitrarily combined together.

In the present invention, the alloy composition is not limited as long as the Ni-based alloy contains Cr and Mo, and, for example, an example of a preferable composition of a configuration member of a semiconductor manufacturing device that is used in severe corrosive environments will be described below.

[Cr: 14.5% to 24.5%]

Cr has an effect of improving corrosion resistance to halogen-based gases such as HCL, $Cl_2$, HF, $F_2$, $NF_3$, $ClF_3$ and HBr that are used in semiconductor manufacturing devices. Particularly, when the configuration member of the semiconductor manufacturing device once comes into contact with an external air at the time of opening the semiconductor manufacturing device, if moisture originating from the atmosphere is adsorbed to a metal surface, and the adsorbed moisture and a halogen-based process gas are hydrated, electrochemical corrosion occurs. Cr exhibits its corrosion resistance to hydrated acids particularly in a region where the concentration is relatively low. In that case, 14.5% or more of Cr needs to be contained. However, when more than 24.5% of Cr is contained, in the combination with Mo, it becomes difficult to maintain a single phase which impairs phase stability during additive manufacturing. Then, a coarse µ phase is formed, and the corrosion resistance also deteriorates. Therefore, the amount of Cr is preferably set to 14.5% to 24.5%.

The upper limit of Cr is more preferably 22.5% and still more preferably 20.5%. In addition, the lower limit of Cr is more preferably 15.0% and still more preferably 18.0%.

[Mo: 12.0% to 23.0%]

Similar to Cr, Mo has an effect of improving corrosion resistance to halogen-based gases such as HCL, $Cl_2$, HF, $F_2$, $NF_3$, $ClF_3$ and HBr. Particularly, Mo exhibits its corrosion resistance to hydrated acids in a region where the concentration is intermediate or high. In order for that, 12.0% or more of Mo is preferably contained. However, when more than 23.0% of Mo is contained, the oxidation property of Mo at high temperatures deteriorates. Therefore, when a powder is produced by the gas atomization method, an oxide film that is formed on each powder surface becomes thick, and there is a concern that a defect attributed to an oxide may be actualized in an additive manufacturing article produced using this powder. Therefore, the content is preferably set to 12.0% to 23.0%.

The upper limit of Mo is more preferably 20.5% and still more preferably 19.5%. In addition, the lower limit of Mo is preferably 14.0% and more preferably 16.0%.

[Other Elements]

The Ni-based alloy in the additive manufacturing article of the present embodiment has a basic composition of Cr: 14.5% to 24.5%, Mo: 12.0% to 23.0%, the balance Ni and unavoidable impurities. In a case where the Ni-based alloy according to the present embodiment is composed of Cr, Mo and Ni, other arbitrary elements can be contained as necessary in addition to the main configuration elements. Hereinafter, these arbitrary elements will be described.

[Fe: 0.01% to 7.00%]
[Co: 0.001% to 2.500%]

Fe and Co have a higher melting point than Ni, have an effect of increasing the viscosity of a molten metal, facilitate the control of particle diameters at the time of producing a powder, and are capable of suppressing the generation of fine powder having particle diameters of smaller than 5 µm, for which additive manufacturing is likely to become difficult.

[N: 0.001% to 0.040%]
[Mn: 0.0010% to 0.50%]
[Mg: 0.0001% to 0.010%]

When N, Mn and Mg are made to coexist, there is an effect of suppressing microsegregation. At the time of additive manufacturing, each powder particle is instantly turned into a molten metal by irradiation with the heat source and solidified by relatively rapid cooling, whereby the powder is molded. Since N, Mn and Mg have an effect of stabilizing an Ni-fcc phase, which is a parent phase, to accelerate the formation of a solid solution of Cr and Mo, as a result, the occurrence of microsegregation during rapid cooling and solidification is suppressed.

[Si: 0.001% to 0.200%]
[Al: 0.001% to 0.500%]
[Ti: 0.001% to 0.500%]

When added as a deoxidizing agent, Si, Al and Ti each have an effect of enhancing cleanness in the alloy. This makes a powder and a powder join smoothly during additive manufacturing, and as a result, suppresses a defect in the additive manufacturing article.

[Cu: 0.001% to 0.250%]

Cu has an effect of improving corrosion resistance in reducing wet corrosive environments such as hydrochloric acid or hydrofluoric acid. Therefore, Cu becomes effective for electrochemical corrosion that is formed by the process gas and the moisture adsorbed to the metal surface.

[V: 0.001% to 0.300%]

V has an effect of suppressing the generation of powder having coarse diameters at the time of producing a powder with gas atomize. In powder having too large diameters, the gaps between the particles become large at the time of additive manufacturing, whereby a defect is actualized, which is not preferable.

[B: 0.0001% to 0.0050%]
[Zr: 0.00010% to 0.0200%]

B and Zr each become a nucleus in the solidification process and have an effect of preventing the generation of shrinkage cavities. At the time of forming an additive manufacturing article, a process of melting and solidifying each powder is repeated; however, when shrinkage cavities are generated in the solidification process, those defects serve as generation sources of particles, and thus the additive manufacturing article becomes inappropriate as an additive manufacturing article that is used as a member or component for semiconductor manufacturing devices.

[O: 0.0010% to 0.0300%]

O instantly bonds mainly to Cr and forms an extremely thin and strong oxide film on the powder surface in a high-temperature state immediately after solidification in a spraying process of a molten metal at the time of producing a powder and thereby has an effect of suppressing the progress of any further oxidation. This suppresses the amount of an oxide originating from the powder which is contained by accident as a foreign matter in the additive manufacturing article at an extremely low level. When 0.0010% or more of O is contained, such an effect is exhibited; however, when more than 0.0300% of O is contained, the oxide on the powder surface actualizes a defect in the additive manufacturing article, and thus the O content is set to 0.0010% to 0.0300%.

The O content is as described above, and, from the viewpoint of obtaining a sound additive manufacturing article, the upper limit of O is preferably 0.0200% and more preferably 0.0100%. In addition, the lower limit of O is preferably 0.0020% and more preferably 0.0050%.

[Ta: 1.0% to 2.5%]

Ta has an effect of improving corrosion resistance in reducing acids or oxidative acids or corrosion resistance to pitting corrosion or crevice corrosion and is thus added as necessary.

[W: 2% to 5%]

W, similar to Mo, has an effect of improving corrosion resistance to reducing acids, simultaneously, increases the melting point to increase the viscosity of a molten metal, facilitates the control of particle diameters at the time of producing a powder, and is capable of suppressing the generation of fine powder (having particle diameters of smaller than 5 μm) for which additive manufacturing is likely to become difficult. Therefore, W is contained as necessary within a range of 2% to 5%.

As the other unavoidable impurities, C forms a carbide with Cr in the vicinity of crystal grain boundaries and intensifies the deterioration of corrosion resistance. Therefore, C is preferably set to less than 0.05%. In addition, S or P is segregated in grain boundaries, serves as a cause for hot cracking, and is thus preferably suppressed to less than 0.01%.

In addition, the amount of these unavoidable impurities is preferably as small as possible and may be 0%.

In the composition analysis of the additive manufacturing article 1, inductively coupled plasma (ICP)-optical emission spectrometry is used for the main configuration elements, and each method of the infrared absorption method after combustion (carbon), the inert gas fusion thermal conductivity detection (nitrogen) and the inert gas fusion infrared absorption method (oxygen) can be used for the impurity elements.

[Raw Material Alloy Powder]

The Ni-based alloy according to the present embodiment has the above-described composition; however, in order to mold the additive manufacturing article, a raw material alloy powder having the above-described composition is prepared. The chemical composition of the raw material alloy powder is basically the same as the chemical composition of the additive manufacturing article; however, in a case where the additive manufacturing article includes an oxide film having excellent corrosion resistance in the surface layer, the oxygen content of the additive manufacturing article is higher than the oxygen content of the raw material alloy powder. The oxide film will be described below.

The chemical compositions of the raw material alloy powder and the additive manufacturing article can be measured by dissolving the raw material alloy powder or the additive manufacturing article in an appropriate aqueous solution and performing the inductively coupled plasma (ICP) analysis on this aqueous solution. In addition, for C, S, N and O, the amounts thereof can be obtained by performing a gas analysis by the combustion method.

The additive manufacturing method is a method in which a desired shape is obtained by repeatedly melting and solidifying each powder. However, when the particle diameters of the raw material alloy powder are too small, it becomes difficult to obtain a volume necessary for a single round of melting and solidification, and thus it is difficult to obtain a sound additive manufacturing article. Conversely, when the particle diameters of the raw material alloy powder are too large, the volume necessary for a single round of melting and solidification becomes large, and it is difficult to obtain a sound additive manufacturing article. Therefore, the particle diameters of the raw material alloy powder being used are within a range of approximately 5 to 500 μm, but the required particle size distribution differs in the powder bed method and the laser metal deposition method. In the powder bed method, the particle diameter d50 that corresponds to a cumulative frequency of 50 vol % of powder in a cumulative distribution curve showing the relationship between particle diameters and volume cumulation from the small particle diameter side, which is obtained by the laser diffraction method, is preferably set to 10 to 60 μm. In addition, in the laser metal deposition method, the particle diameter d50 is preferably set to 30 to 250 μm. Regarding the particle diameters of the powder, the particle size distribution can be measured using a laser diffraction-type particle size distribution measuring instrument.

For the production of the raw material alloy powder, the gas atomization method, the water atomization method, the jet atomization method, or the like can be used. Since the raw material alloy powder preferably has a spherical shape, the raw material alloy powder is preferably produced by the gas atomization method.

[Applications]

The applications of the additive manufacturing article according to the present embodiment are arbitrary, and mechanical properties suitable for applications can be obtained depending on whether or not a solution heat treatment is performed.

As an example of the applications, the additive manufacturing article according to the present embodiment can be applied to semiconductor manufacturing devices in which highly corrosive halogen-based gases represented by HCL, $Cl_2$, HF, $F_2$, $NF_3$, $ClF_3$ and HBr are handled.

Particularly, the additive manufacturing article is preferably applied to members of semiconductor manufacturing devices with which these gases come into direct contact. In addition, as other applications, the additive manufacturing article according to the present embodiment is preferably applied to valves or joints in chemical plants, heat exchangers, pumps, turbine holes in generators and the like, impellers of compressors, and the like through which corrosive fluids flow.

On the surface of the additive manufacturing article having the oxide film according to the present embodiment, the portion in which the oxide film is to be provided is selected according to a member in an application to which the additive manufacturing article is applied. That is, in a case where the entirety of the member comes into contact with a corrosive environment such as corrosive gas or liquid, the oxide film according to the present embodiment is preferably formed on the entirety of the member. In addition, in a case where only a part of the member comes into contact with a corrosive environment such as corrosive gas or liquid, the oxide film according to the present embodiment is preferably formed on only the part of the member. As described above, the oxide film can be formed so as to be suited to a corrosive environment contact surface. It is needless to say that, even in a case where only a part of the member becomes the corrosive environment contact surface of corrosive gas, liquid or the like, the oxide film according to the present embodiment may be formed on the entirety of the member. In addition, in order to configure a joining surface with other members, mechanical processing such as polishing or grinding may be performed on a part of the oxide film, and, in this case, the oxide film may be formed only partially due to the processing.

In the present embodiment, the surface on which the oxide film has been formed is a surface as additive manufactured on which no mechanical processing such as polishing or grinding is performed (as built surface).

EXAMPLE

Hereinafter, the present invention will be specifically described based on an example.

A raw material alloy powder for additive manufacturing having a chemical composition shown in Table 1 was prepared. A dissolved raw material was prepared, the dissolved raw material was dissolved using an ordinary high-frequency vacuum dissolution furnace to produce a parent alloy, and the raw material alloy powder was produced in an argon atmosphere by the gas atomization method. From the atomized powder, powder having particle diameters of 20 to 80 μm were classified and subjected to additive manufacturing. d10, d50 and d90 of the classified powder were 15.6 μm (d10), 25.3 μm (d50) and 50.2 μm (d90), respectively.

TABLE 1

| | Mass % | | | | Ni + unavoidable |
|---|---|---|---|---|---|
| | Mo | Cr | Ta | O | impurities |
| Alloy powder | 18.9 | 19.3 | 1.69 | 0.008 | Bal. |
| Additive manufacturing article | 18.9 | 19.3 | 1.69 | 0.02 | Bal. |

Additive manufacturing was performed under the following conditions, thereby producing an additive manufacturing article 1 (30×30×5 mm) (hereinafter, referred to as the manufacturing article). In a shield gas (argon gas) during the additive manufacturing, 540 ppm of oxygen was contained.
  Additive manufacturing apparatus: EOS M290 (SLM method)
  Additive manufacturing conditions
  Energy density: Set to become 20 to 200 J/mm$^3$ Energy density=Laser power (W)/(scanning speed (mm/s)×scanning pitch (mm)×layer thickness (mm))

In the example, the laser power was 300 W, the scanning speed was 800 mm/s, the scanning pitch was 0.1 mm, and the layer thickness was 0.04 mm, and thus the energy density was 94 J/mm$^3$.

Atmosphere: Ar (O$_2$<0.10%)
  Scanning method: Intersection scanning method (here, a laser beam was scanned twice on an XY surface and a Z surface)

For the manufacturing article 1 as well, the chemical composition was analyzed. The results are shown in Table 1 and the amount of oxygen (O) became significantly high. This is understood to be based on the fact that, in the shield gas (argon gas) during the additive manufacturing, 540 ppm of oxygen was contained.

Regarding Mo, Cr and Ta, the composition analysis was performed with Simultix 10 (manufactured by Rigaku Corporation), which is an X-ray fluorescent spectrometer. In addition, regarding O, the composition analysis was performed with ON-836 (manufactured by LECO Japan Corporation), which is an oxygen/nitrogen element analyzer.

[Corrosion Resistance]

Next, corrosion resistance was evaluated using the manufacturing article 1 and a forged article.

For the evaluation of corrosion resistance, two kinds of tests, that is, a corrosion resistance test, in which the manufacturing article 1 and the forged article were immersed in a hydrochloric acid aqueous solution, and a pitting corrosion test were performed. In the evaluation tests of corrosion resistance, the XY surface, a 45° surface, and the Z surfaces refer to the XY surface, the 45° surface, and the Z surfaces shown in the additive manufacturing article of (a) of FIG. 1.

(1) Hydrochloric Acid Immersion Test

The manufacturing article 1 and the forged article were immersed in two kinds of corrosive solutions (1% hydrochloric acid aqueous solution (boiled) and 5% hydrochloric acid aqueous solution (boiled)) for 24 hours, and the corrosion speeds (mm/year) were obtained. The results are shown in (a) and (b) of FIG. 2. In the case of polished test pieces, all of the test pieces were immersed in the corrosive solutions after being polished using 1000-grit abrasive paper.

Figure 2:
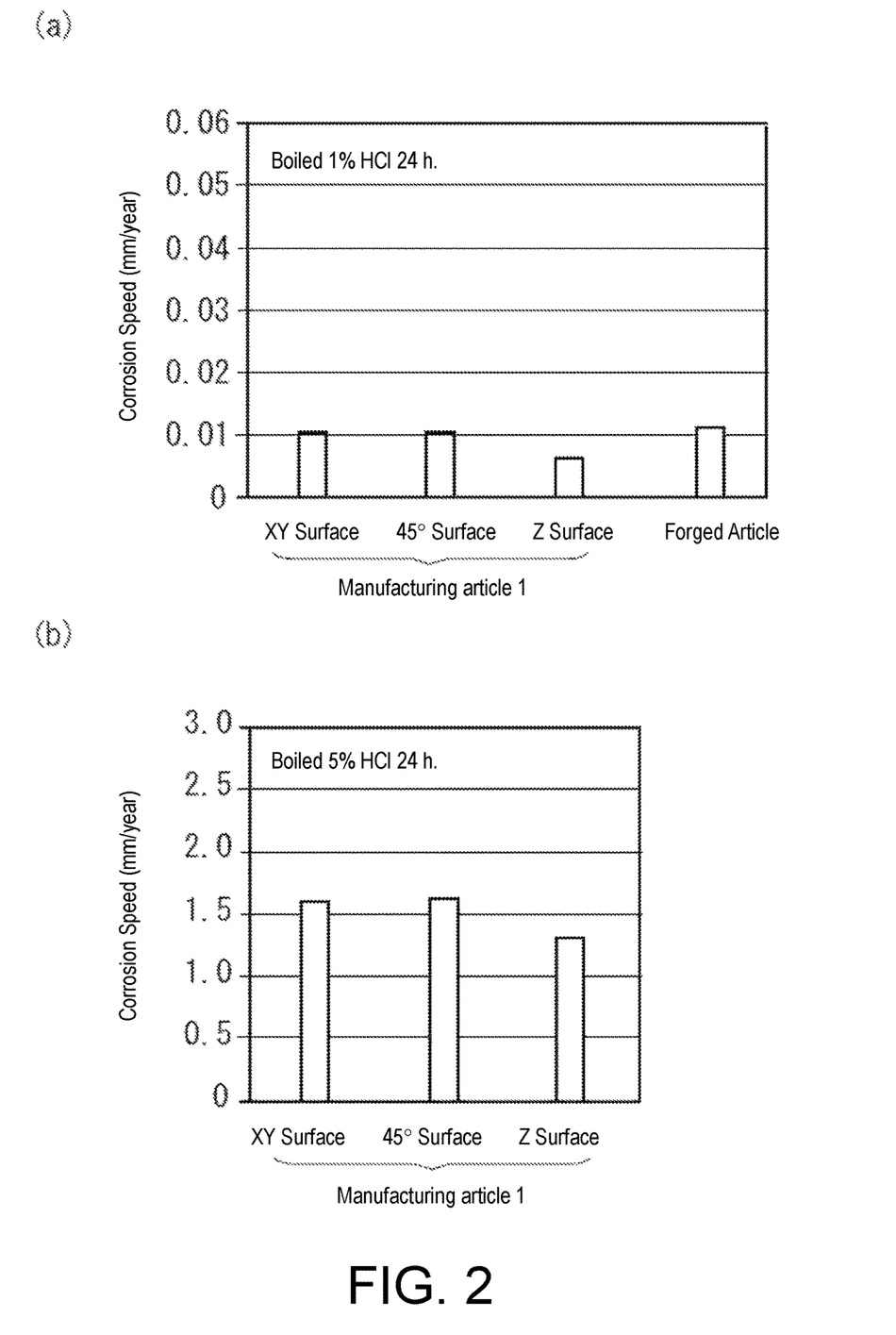

As shown in (a) of FIG. 2, there were no meaningful differences in corrosion speed between the manufacturing article 1 and the forged article. In addition, (b) of FIG. 2 shows that corrosion resistance has no dependence on lamination directions.

(2) Pitting Corrosion Test

In accordance with JIS G 0578, test pieces were immersed in a ferric chloride aqueous solution, and critical temperatures at which pitting corrosion occurred were obtained.

The results are shown in Table 2, and the critical temperatures became higher by approximately 5° C. to 10° C. in unpolished test pieces. An unpolished manufacturing article 1 is referred to as a manufacturing article 1A, and a polished manufacturing article 1 is referred to as a manufacturing article 1B.

In addition, a pitting corrosion test was performed in the same manner, but the same results as in Table 2 were obtained.

TABLE 2

| Testing temperature | 145° C. | ○* | — | ○ | X | ○* |
|---|---|---|---|---|---|---|
| | 140° C. | ○ | X | ○ | ○ | ○ |
| | 135° C. | ○ | ○ | ○ | ○ | ○ |
| | 130° C. | ○ | ○ | ○ | ○ | ○ |
| | 125° C. | ○ | ○ | ○ | ○ | ○ |
| | 120° C. | ○ | ○ | ○ | ○ | ○ |
| | 115° C. | ○ | ○ | ○ | ○ | ○ |
| Tested surface | | Unpolished | Polished | Unpolished | Polished | Forged article |
| Exposed surface | | XY surface | | Z surface | | |
| | | 1A | 1B | 1A | 1B | |
| | | Manufacturing article 1 | | | | |

*Test censored
X Pitting corrosion occur

[Mechanical Properties]

Next, the manufacturing article 1, in addition to the manufacturing article 1, a manufacturing article 2 obtained by performing a solution heat treatment on the manufacturing article 1 and a forged article that had the same chemical composition as the manufacturing article 1 and had been forged and rolled were prepared, and mechanical properties were measured. The results are shown in Table 3. Regarding the conditions of the solution heat treatment, the manufacturing article 1 was retained in the atmosphere at 1180° C. for 30 minutes. In addition, mechanical properties were measured in accordance with JIS. In addition, the XY surface and the Z surface in Table 3 are in accordance with the definitions described using FIG. 1. This is also true below.

As shown in Table 3, it is found that the manufacturing article 1 produced by additive manufacturing obtained more favorable mechanical properties than those of the forged article. In addition, the results of the manufacturing article 2 show that the elongation can be made close to that of the forged article by performing the solution heat treatment. That is, required mechanical properties can be satisfied by selecting the presence or absence of the solution heat treatment.

In addition, it is confirmed that, when an ageing treatment was performed under the above-described conditions after the solution heat treatment, hardness of approximately 400 in terms of HV10 (load: 10 kg) could be obtained.

TABLE 3

|  | Tensile direction | Press stress (MPa) | Tensile strength (MPa) | Elongation (%) | Reduction of area (%) | Vickers hardness (HV10) |
|---|---|---|---|---|---|---|
| Manufacturing article 1 | Z | 623 | 885 | 60 | 63 | 282 (XY surface) |
|  | XY | 754 | 1023 | 45 | 46 | 323 (Z surface) |
| Manufacturing article 2 | Z | 416 | 890 | 76 | 63 | 206 (XY surface) |
|  | XY | 424 | 905 | 72 | 59 | 209 (Z surface) |
| Forged article |  | 381 | 812 | 72 | — | 180 to 200 |

Manufacturing article 2: Manufacturing article 1 that has undergone a solution treatment (1180° C. × 30 min.)
Forged article: Material that has the same chemical composition as the manufacturing article 1 and has been forged and rolled
Characteristic: Average value of three test pieces The above-described evaluation results are summarized as follows.
(1) Corrosion Resistance Between the additive manufacturing articles that had the same chemical composition and were produced under the same laminating conditions, the corrosion resistance was excellent in the additive manufacturing article that was not polished.
(2) Mechanical Properties Compared with the forged article, the proof stress, the tensile strength and the hardness improved in the additive manufacturing article.

Hereafter, observation performed to clarify causes for making it possible to obtain the above-described evaluation results will be described.
[Observation of Element Behaviors in Surface Layer]

In the manufacturing article 1A (not polished) and the manufacturing article 1B (polished), the behaviors of elements in the surface layers were observed. The results of the individual elements are shown in (a) of FIG. 3 and (b) of FIG. 3. This observation was performed mainly to recognize the reason for improvement in corrosion resistance. The observation conditions are as follows.

Apparatus: ESCA-5400R (3057 customized) manufactured by ULVAC-PHI, Inc.

X-ray (Mgkα): 15.0 kV and 26.7 mA (400 W)
Detection depth: 20 nm (takeoff angle: 45°)
Analysis region: 800 μmϕ
Sputtering conditions (Ar$^+$): Accelerating voltage of 2 kV and raster sizes of 3×3 mm
Sputtering speed: Approximately 2.0 nm/min ($SiO_2$ equivalent)

Figure 3:
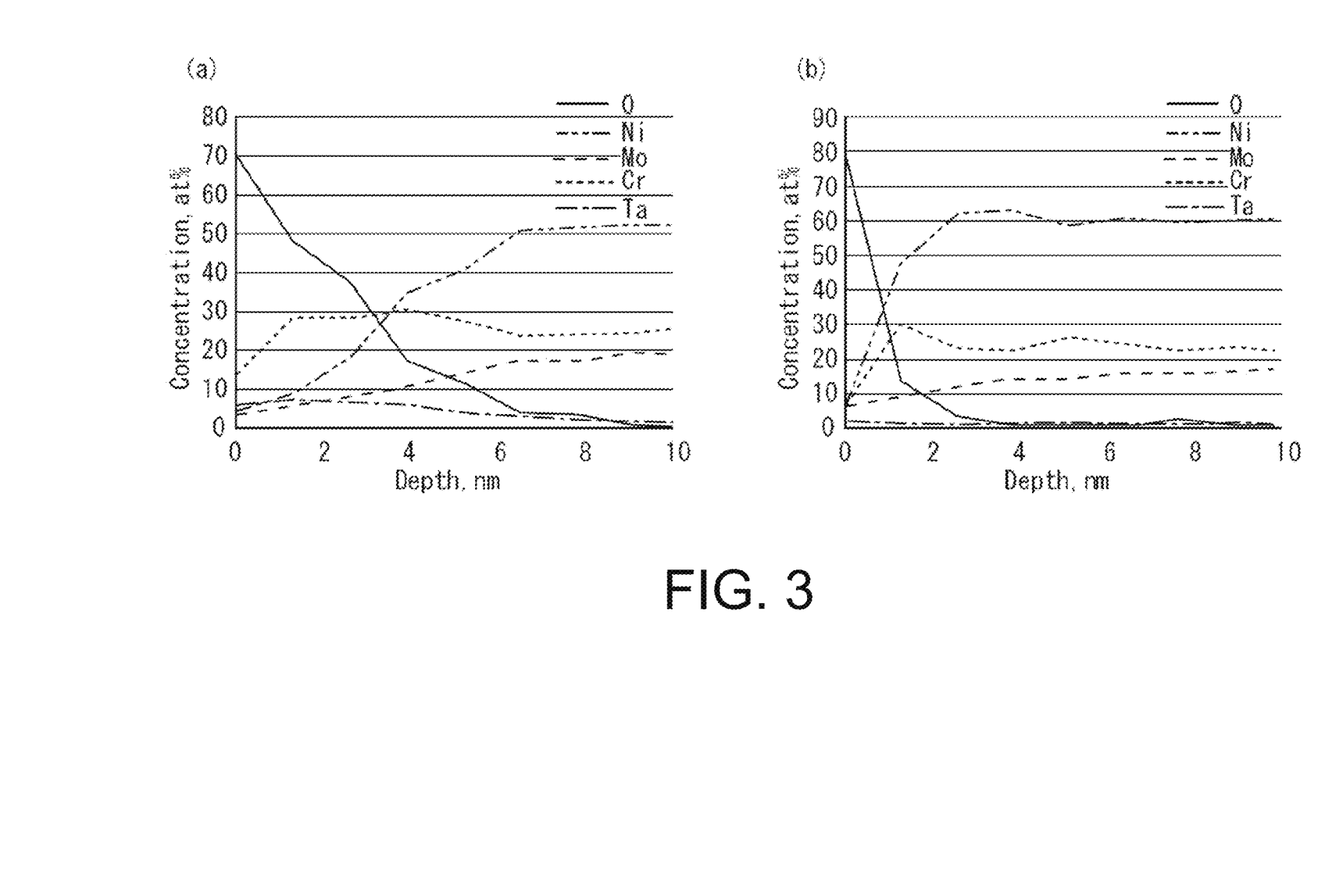

As shown in (a) of FIG. 3, it is assumed that, in the manufacturing article 1A, a thin film composed of an oxide was formed on a surface layer portion. From the concentration ratio between Cr and O in this surface layer portion, this oxide is admitted as chromium oxide ($Cr_2O_3$). The contents of oxygen and Cr in the surface layer portion show that the chromium oxide was formed in a range of up to approximately 3 nm in the depth direction, and, since a significant oxygen concentration is observed even in a depth of larger than 3 nm, in the manufacturing article 1A, it is admitted that the chromium oxide had a thickness of approximately 6 nm.

When attention is paid to the contents of Cr and Ni in the surface layer portion, the Cr content is larger than the Ni content in a range of approximately 3 nm from the surface. In this region, an oxide of Ni (NiO) is assumed to be contained, and it is understood from the contents of Cr and Ni that the amount of the chromium oxide generated was larger, and the chromium oxide and the nickel oxide were contained in this region, but an oxide film that was mainly composed of Cr was formed.

In a region deeper than approximately 3 nm from the surface, the Cr content and the Ni content were reversed. In addition, when the depth from the surface exceeded approximately 6 nm, a metal component region in which both the Cr content and the Ni content were stabilized was formed. In a region from the point where the Cr content and the Ni content were reversed to the metal component region of Cr and Ni, since the Ni content was larger than the Cr content, it is understood that chromium oxide and nitrogen oxide or nickel chromium oxide are contained, but an oxide film that was mainly composed of Ni was formed.

As shown in (b) of FIG. 3, it is assumed that, in the manufacturing article 1B as well, a thin film composed of an oxide was formed on a surface layer portion, but the Ni content was larger than the Cr content. Therefore, in the manufacturing article 1B, it is admitted that, in the surface layer region, chromium oxide was not present or, even when chromium oxide was present, the amount of nitrogen oxide was larger and an oxide film that was mainly composed of Ni was formed. In the manufacturing article 1B, the surface was polished, but the surface came into contact with the atmosphere during the polishing or after the polishing and was thus oxidized naturally, which made oxygen ($O_2$) contained in the surface layer region.

[Consideration of Corrosion Resistance]

The manufacturing article 1A that was not polished after additive manufacturing exhibited more favorable corrosion resistance than the manufacturing article 1B that had been polished, and, in the manufacturing article 1A, the oxide was formed in an extremely thin range in the surface layer.

This oxide is understood to be formed due to a difference in additive manufacturing, and this arises from the fact that oxygen ($O_2$) was contained in the argon gas (Ar gas), which was the shield gas. The amount of oxygen in this argon gas was approximately 10 to 2000 ppm as described above and was a small amount compared with approximately 20%, which is the amount of, for example, oxygen in the atmosphere. The oxygen that was contained in a small amount was exposed to a high-temperature atmosphere (1300° C. to 1800° C.) in which the alloy powder was melted during additive manufacturing, whereby a dense oxide was formed. Furthermore, on the XY surface and the Z surfaces, that is, the surfaces of the additive manufacturing article for which the corrosion resistance had been evaluated, a laser beam was scanned twice along the same scanning path. It is understood that this scanning of the laser beam that was performed twice contributed to the generation of the denser oxide.

[Structural Observation of Manufacturing Article 1]

Next, the observation results of the structure of the manufacturing article 1 will be described. This observation was performed mainly to recognize the reason for improvement in mechanical strength.

Figure 4:
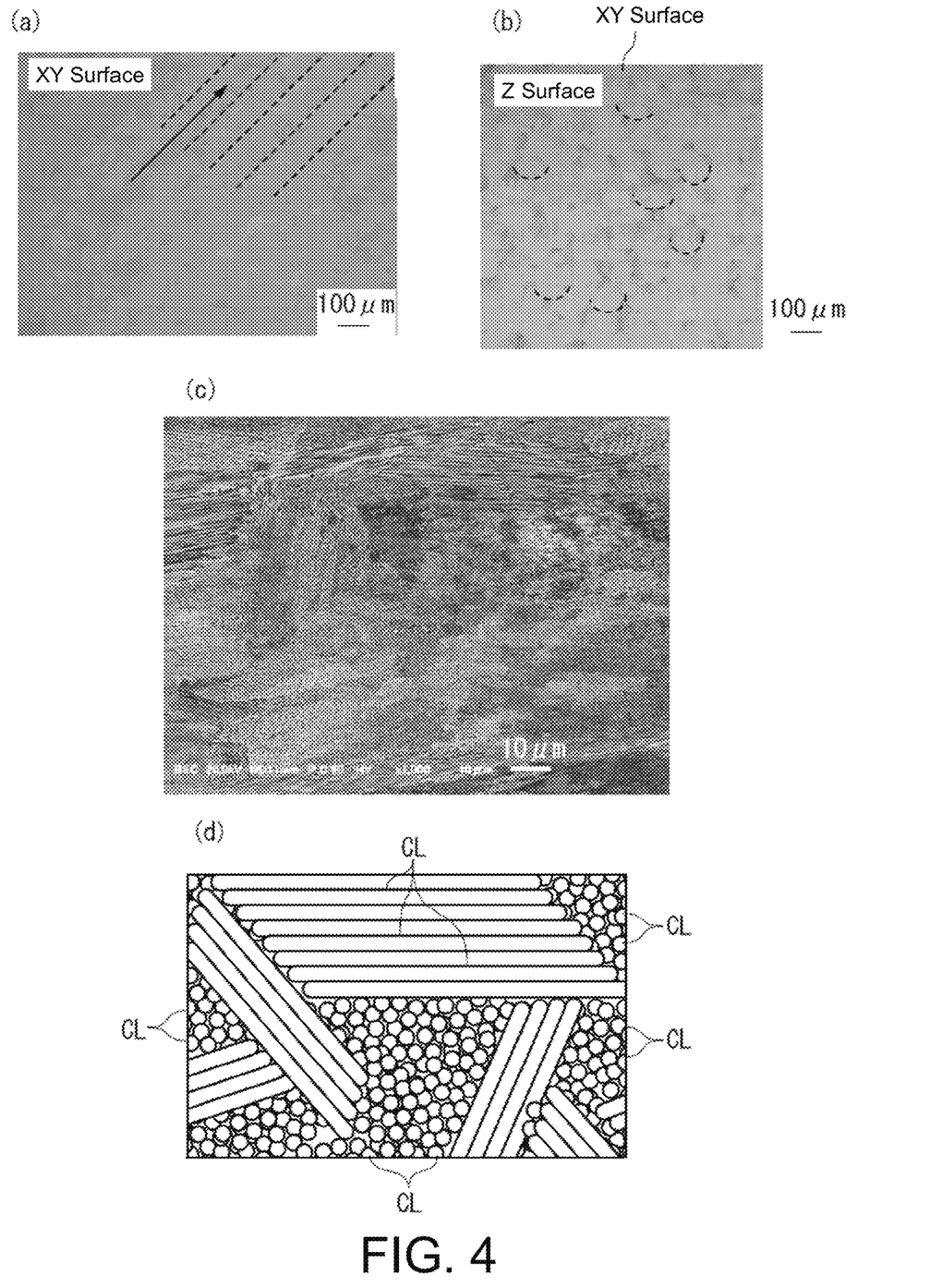

(a) of FIG. 4 and (b) of FIG. 4 show the observation results of the XY surface and the Z surface of the manufacturing article 1 that had been polished and etched, which were observed with an optical microscope.

As shown in (a) of FIG. 4, on the XY surface, linear boundaries were observed at intervals of approximately 100 μm. It is understood that these boundaries corresponded to boundaries with other scanning paths when the laser beam was scanned on the XY surface. In (a) of FIG. 4, the linear boundaries are indicated by broken lines, and the scanning orientation of the laser beam is indicated by an arrow.

Next, as shown in (b) of FIG. 4, on the Z surface, semicircular boundaries were observed. It is understood that these boundaries corresponded to boundaries on the bottom surface side of molten pools formed at the time of scanning the laser beam. The semicircular boundaries are indicated by broken lines.

(c) of FIG. 4 shows a scanning electron microscopic (SEM) image of the Z surface of the manufacturing article 1 after etching, and (d) of FIG. 4 is a pattern diagram of the structure drawn with reference to (c) of FIG. 4. As shown in (c) of FIG. 4 and (d) of FIG. 4, nano-order cells CL were observed. In (d) of FIG. 4, elongated columnar cells are the cells CL, and it is assumed that crystal grains observed in (b) of FIG. 4 were formed by the aggregation of these columnar cells CL. In (d) of FIG. 4, cells that appear circular are also the cells CL, and these cells CL appear circular since the cells extended toward the back of the drawing. In addition, the form of the structure shown in (c) of FIG. 4 and (d) of FIG. 4 is similar to a structure that is generally formed by welding, but a single cell had a thickness of approximately 1 μm or smaller and a length of approximately 100 μm, and, when compared with weld structures, the structure was composed of cells that were small by approximately three to six orders of magnitude.

[Consideration of Mechanical Strength Based on Structure]

Figure 5:
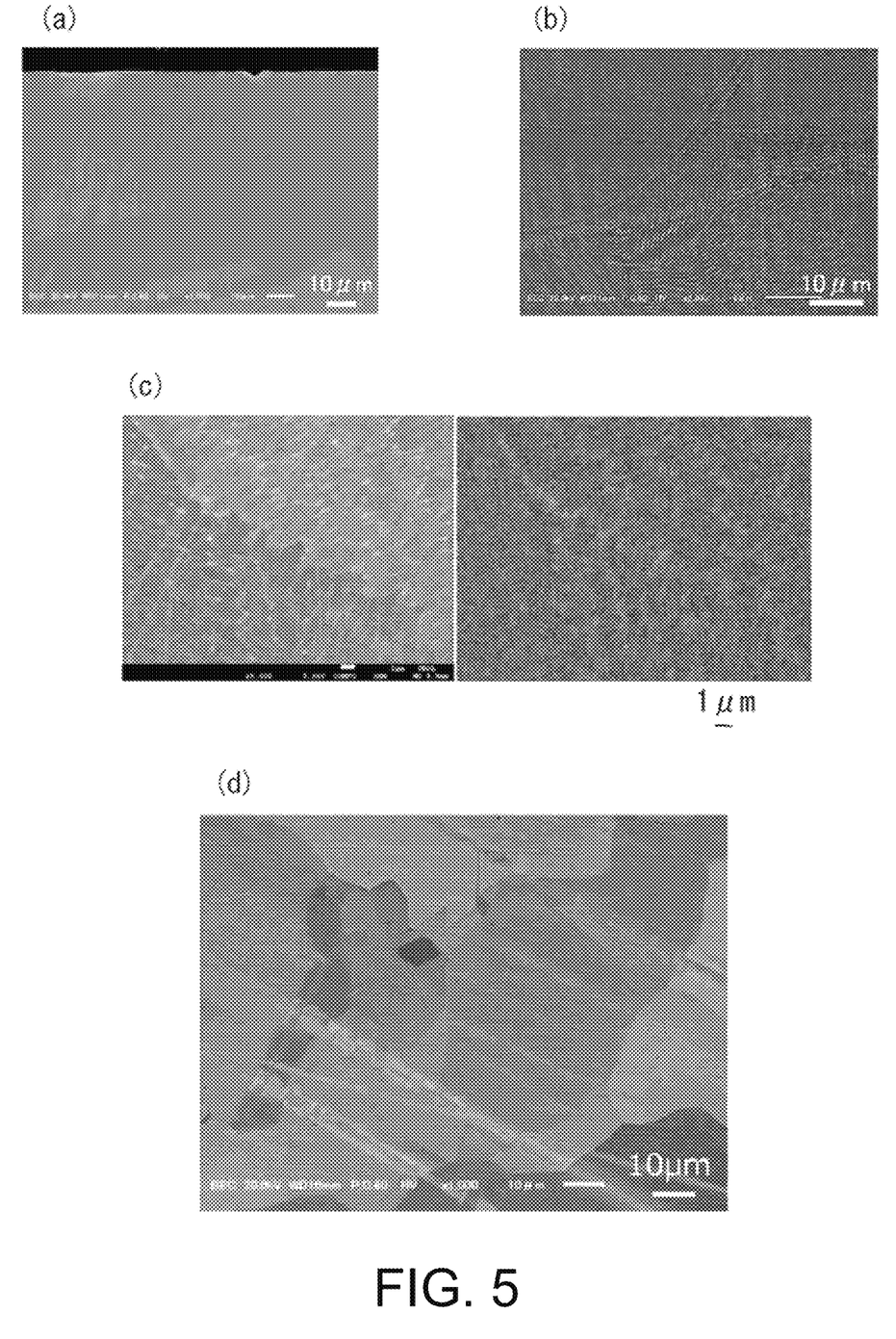

(a) of FIG. 5 shows a reflected electron image of the forged article captured with a SEM, and (b) of FIG. 5 shows a reflected electron image of the manufacturing article 1 captured with the SEM. Fine white regions that were not observed in the forged article ((a) of FIG. 5)) were observed in the manufacturing article 1 ((b) of FIG. 5). In addition, (c) of FIG. 5 shows the composition maps of Mo in the manufacturing article 1 observed by energy dispersive X-ray spectroscopy (EDX) with the SEM.

From a cross-check of (b) of FIG. 5 and (c) of FIG. 5, it is confirmed that the white regions that were observed in (b) of FIG. 5 were segregated Mo in which Mo became richer than other regions. It is assumed that these segregated Mo was formed between adjacent cell structures.

(d) of FIG. 5 shows a reflected electron image of the manufacturing article 2 that had undergone a solution treatment, which was captured with the SEM, and it is found that the white regions, that is, the segregated Mo formed solid solutions in the base and disappeared due to the solution treatment. However, since the mechanical properties (proof stress and tensile strength) of the manufacturing article 2 were more favorable than those of the forged article as described above, there is a possibility that the segregated Mo might remain instead of disappearing.

Figure 6:
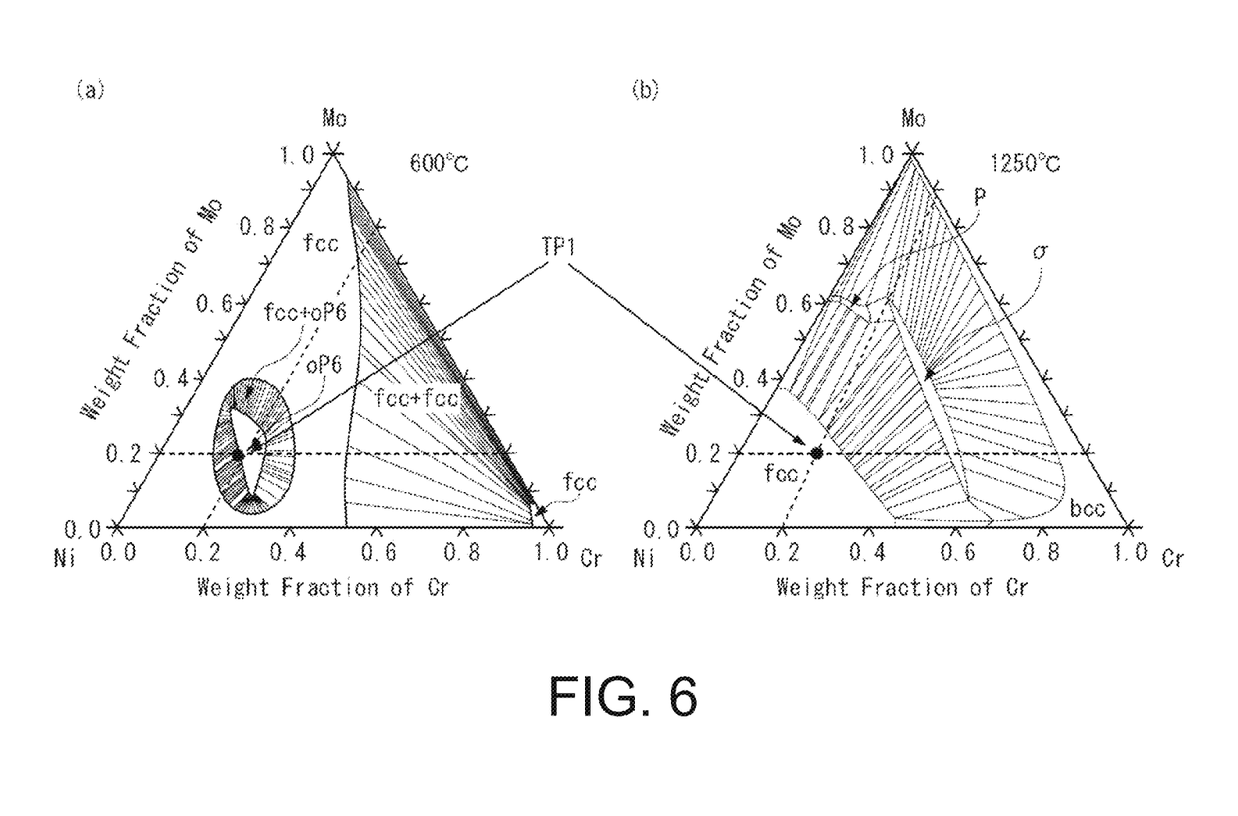

Here, (a) and (b) of FIG. 6 show ternary calculation phase diagrams of Ni, Cr and Mo. The chemical composition of the manufacturing article 1 corresponds to TP1 in (a) and (b) of FIG. 6. As is understandable from the phase diagram at 600° C. ((a) of FIG. 6), in the chemical composition of the manufacturing article 1, a P phase was precipitated at low temperatures. This P phase or u phase is a Mo-rich phase, and, when this phase is precipitated, conversely, a region in which the amount of Mo is small is formed.

It is understood that the segregated Mo in the additive manufacturing article 1 is the p phase, which is an intermetallic compound containing Mo, Cr and Ni as the configuration elements. The μ phase is recognized as a harmful phase to mechanical properties, but it is assumed that the segregated Mo in the manufacturing article 1 was fine and was thus no harmful phase and capable of contributing to improvement in mechanical properties.

The invention claimed is:

1. An additive manufacturing article comprising:
a Ni-based alloy that contains Cr and Mo, while containing Ni in a largest amount in terms of a mass ratio,
wherein an oxide film comprising Cr and Ni is formed in a part or an entirety of a surface,
containing in the Ni-based alloy, Cr is in a range of 14.5% mass % to 24.5 mass % and Mo is a range of 12.0 mass % to 23.0% mass %,
the oxide film has a surface layer part and an inner part, wherein in a region of the surface layer part, an O content is higher than the O content in the inner part, and a Cr content is higher than an Ni content, and
the oxide film has a region in the inner part where the Ni content is higher than the Cr content.

2. The additive manufacturing article according to claim 1,
wherein the oxide film has a thickness of 1 to 20 nm from the surface.

3. The additive manufacturing article according to claim 1,
wherein the oxide film is formed so as to be suited to a corrosive environment contact surface.

4. The additive manufacturing article according to claim 1 that is a component for semiconductor manufacturing device.

5. A method for producing an additive manufacturing article comprising:
- a step of producing, by additive manufacturing, an additive manufacturing article composed of a Ni-based alloy that contains Cr and Mo, while containing Ni in a largest amount in terms of a mass ratio,
- wherein, at the time of the additive manufacturing, an oxide film comprising Cr and Ni is formed in a part or an entirety of a surface of the additive manufacturing article,
- containing in the Ni-based alloy, Cr is in a range of 14.5 mass % to 24.5 mass % and Mo is in a range of 12.0 mass % to 23.0 mass %,
- the oxide film has a surface layer part and an inner part, wherein in a region of the surface layer part, an O content is higher than the O content in the inner part, and a Cr content is higher than an Ni content, and
- the oxide film has a region in the inner part where the Ni content is higher than the Cr content.

6. The method for producing an additive manufacturing article according to claim 5,
- wherein the additive manufacturing of the additive manufacturing article is performed by powder bed fusion in which a laser beam or an electron beam is used, and
- the additive manufacturing is performed in an atmosphere having an oxygen concentration of 10 to 2000 ppm.

7. The method for producing an additive manufacturing article according to claim 5,
- wherein the surface of the additive manufacturing article on which the oxide film is to be formed is irradiated with a laser beam or an electron beam repeatedly twice or more.

* * * * *